United States Patent [19]
Hanley

[11] Patent Number: 6,025,848
[45] Date of Patent: Feb. 15, 2000

[54] ANCILLARY DATA DISTRIBUTION DISPLAY

[75] Inventor: Mark Hanley, Lake Oswego, Oreg.

[73] Assignee: Tektronix, Inc., Wilsonville, Oreg.

[21] Appl. No.: 09/013,847

[22] Filed: Jan. 27, 1998

[51] Int. Cl.[7] .................................................. G06T 11/00
[52] U.S. Cl. ............................ 345/440; 348/184; 348/479
[58] Field of Search ..................................... 345/440, 329,
345/330; 348/184, 185, 479, 180, 192,
473, 480, 481; 709/219, 231

[56] References Cited

U.S. PATENT DOCUMENTS

| | | | |
|---|---|---|---|
| 5,347,452 | 9/1994 | Bay, Jr. | 364/408 |
| 5,808,689 | 9/1998 | Small | 348/476 |
| 5,874,950 | 2/1999 | Broussard et al. | 345/302 |
| 5,929,863 | 7/1999 | Tabei et al. | 345/440 |

*Primary Examiner*—Mark R. Powell
*Assistant Examiner*—Mano Padmanabhan
*Attorney, Agent, or Firm*—Francis I. Gray

[57] ABSTRACT

An ancillary data distribution display presents a graphic display in Cartesian coordinates of the video line numbers for a video frame from a serial digital video data stream along one axis and a data count for each line along the other axis for ancillary data extracted from the serial digital video data stream. The data count may represent packets of data, words of data or normalized delta values based upon the average number of data words per line for the video frame. The axis representing the data count is adaptive according to the maximum data count for the data type per video frame displayed. A particular line of the serial digital video data stream may be selected, with the graphical representation being highlighted as a cursor and the selected line number and the corresponding data count being displayed alphanumerically. The video frame may be split to provide two halves of the frame side-by-side on the display.

12 Claims, 4 Drawing Sheets

ANCILLARY DATA DISTRIBUTION DISPLAY

CROSS-REFERENCE TO RELATED APPLICATIONS

Not applicable

STATEMENT REGARDING FEDERALLY FUNDED RESEARCH OR DEVELOPMENT

Not applicable

BACKGROUND OF THE INVENTION

The present invention relates to graphical interfaces, and more particularly to an ancillary data distribution display for a serial digital video instrument.

The standard for serial digital video data includes the provision of including ancillary data between the end of the active video (EAV) marker at the end of one video line and the start of active video (SAV) marker at the beginning of the next line. Data that may be added as ancillary data includes digital audio data, test data and other miscellaneous data. Digital audio data may represent from one to four audio channels, with the audio data for each channel being grouped into a packet of data words including a header and checksum.

What is desired is a method of displaying the distribution of the ancillary data from the serial digital video data stream in order to determine the characteristics of a particular serial digital video system.

BRIEF SUMMARY OF THE INVENTION

Accordingly the present invention provides an ancillary data distribution display with various distribution formats. These formats include a packet format, a data word format and a delta format. A frame of the serial digital video data is acquired and the ancillary data is parsed from the video data. A distribution matrix is generated that indicates for each video line in the frame the number of packets and data words in the ancillary data as well as a normalized delta value that is based on the average number of data words per line for the frame. A line graph is generated that presents the ancillary data distribution display in Cartesian coordinates, with line numbers along one axis and data values along the other. Appropriate tic marks with representative values are provided along the axes, the data value axis being adaptive according to the largest data value to be displayed for the frame. The resulting line graph is loaded into a back bit plane in a display memory along with the distribution data in the selected format. A cursor, representing a selected one of the lines, together with the corresponding alpha-numeric coordinate values for the selected line (line number and data value) are loaded into a front bit plane in the display memory. The intensity of each bit plane is independently controlled so that the cursor and corresponding coordinate values may stand out against the distribution display.

The objects, advantages and other novel features of the present invention are apparent from the following detailed description when read in conjunction with the appended claims and attached drawing.

DETAILED DESCRIPTION OF THE INVENTION

Figure 1:
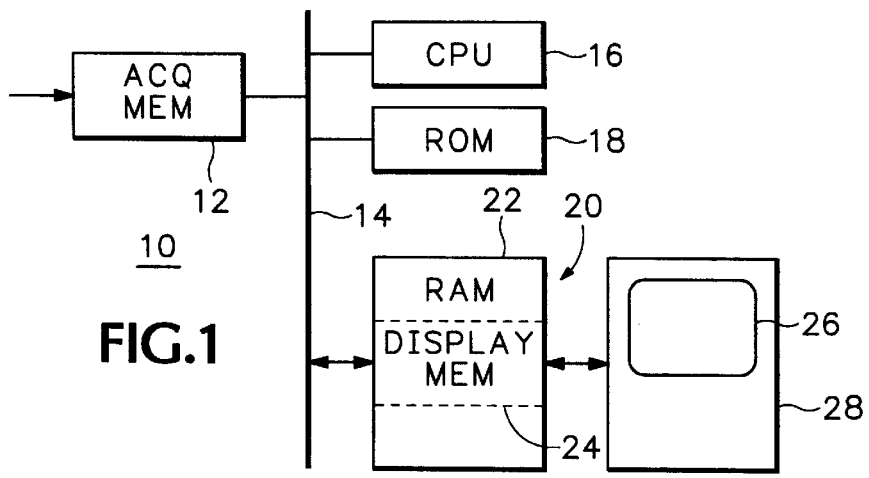
FIG. 1 is a block diagram view of an instrument capable of providing an ancillary data distribution display according to the present invention.

Referring now to FIG. 1 a serial digital video data stream is received by an instrument 10, such as the Tetkronix VM700T Video Measurement Set manufactured by Tektronix, Inc. of Wilsonville, Oreg., United States of America, and is captured by an acquisition memory 12 on a frame by frame basis. The acquisition memory 12 is coupled to a bus 14 to which is coupled a central processing unit (CPU) 16 with associated read only memory (ROM) 18. Also coupled to the bus 14 is a display system 20 that includes a working random access memory (RAM) 22, a display refresh memory 24 and a display device 26 in an instrument panel 28. The serial digital video data for one frame is transferred from the acquisition memory 12 to the working RAM 22. The ancillary data under control of the CPU 16 is then parsed for each video line from the serial digital video data, as is well known in the art, to build a distribution matrix. The distribution matrix includes for each line the number of packets and data words (excluding headers and checksums) as well as a normalized delta value that is based upon the average number of data words per line per frame. The CPU 16 sets up a line graph and transfers a selected one of the three data types—packet, word or delta—to the graph. The representation for a selected one of the lines, in the form of a cursor and values for each axis of the graph, are also generated by the CPU 16 in a manner to differentiate from the line graph. The resulting distribution display data is transferred from the working memory 22 to the display memory 24. The screen 26 is refreshed from the display memory 24 to provide the selected ancillary data distribution display.

For each line of an acquired video frame a buffer array is generated by the CPU in the working RAM 22. The buffer array has three entries for each line—number of ancillary data packets, number of data words (excluding headers and checksums) and normalized delta values. The display is set up as having a front bit plane and a back bit plane. An operator selects by suitable means, such as touch screen menu, front panel controls and/or a combination thereof, which form of distribution display is desired—packet, data word or delta. The display is prepared by generating a line graph that establishes the framework for the display in the back bit plane—x and y axes with associated tic marks and corresponding values representing line numbers and data values. Then the selected distribution (packet, word or delta) also is loaded into the back bit plane from the buffer array as lines together with other miscellaneous information, such as distribution type, total number of words or packets, etc. In the front plane is loaded a cursor that indicates a particular line selected by the operator from the front panel in the form of a line, an alpha-numeric line number of the particular line for superpositioning over the line number axis display and an alpha-numeric number of packets/words/delta for superpositioning over the packet/word/delta number on the other axis display. The intensity of both bit planes may be controlled independently so that the cursor and associated data representations stand out from the distribution display.

Figure 2:
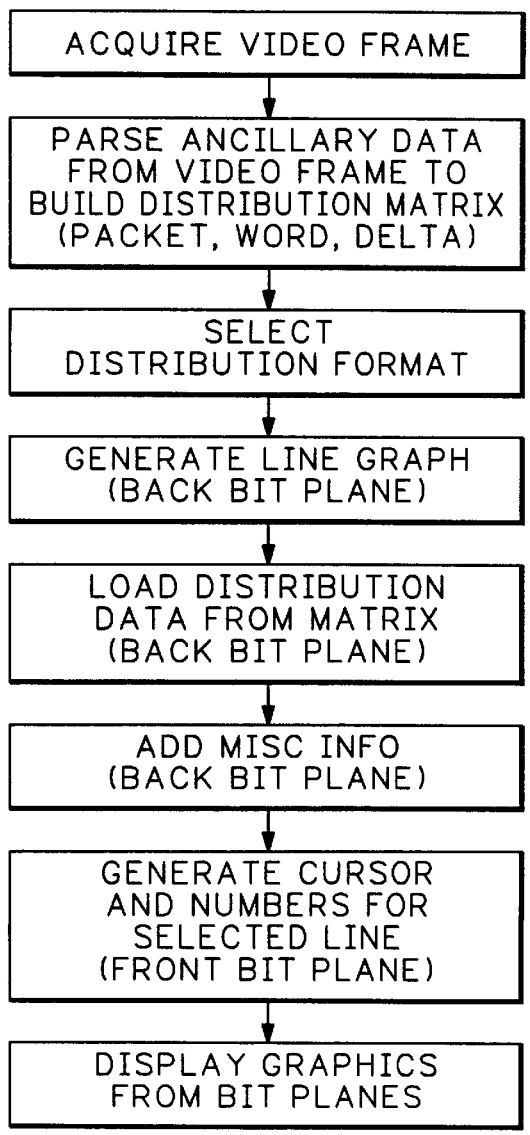
FIG. 2 is a flow diagram view of an algorithm for providing an ancillary data distribution display according to the present invention.

As shown in FIG. 2 an acquired video frame of serial digital video data is transferred from the acquisition memory 12 to the working memory 22, and the frame is parsed to extract and count the number of packets and data words (excluding headers and checksums) for each video line. A delta value for each line also is computed based upon the average number of words per line—the total number of data words per frame is computed and divided by the number of lines in the frame. The actual number of words per line is compared with the average words per line to generate a raw delta value. The raw delta values are then normalized between zero and a maximum value to produce the normalized delta value that is stored for each line in the buffer array together with the number of packets and data words.

Figure 3:
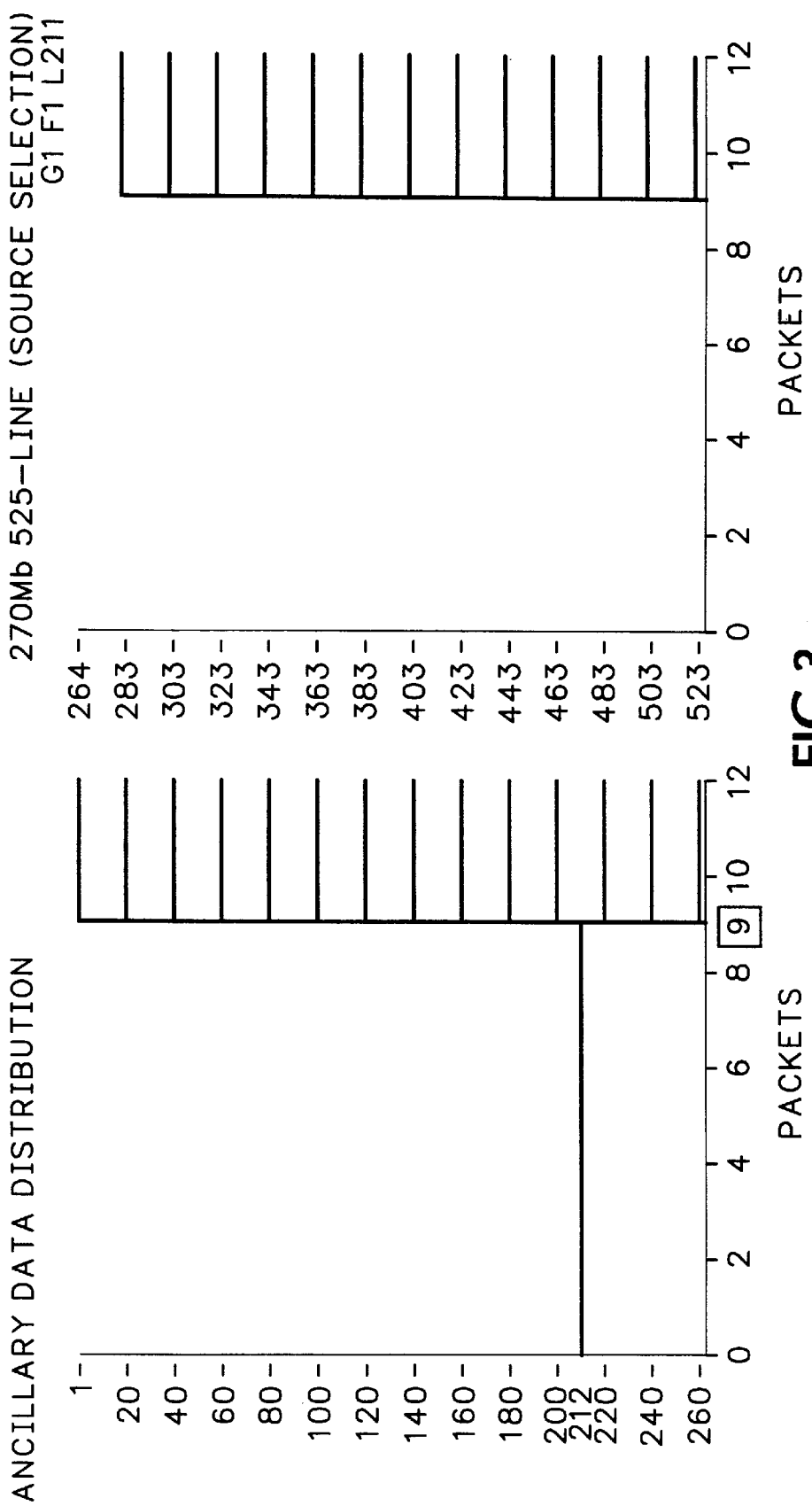
FIG. 3 is a plan view of a screen illustrating a packet ancillary data distribution display according to the present invention.
Figure 4:
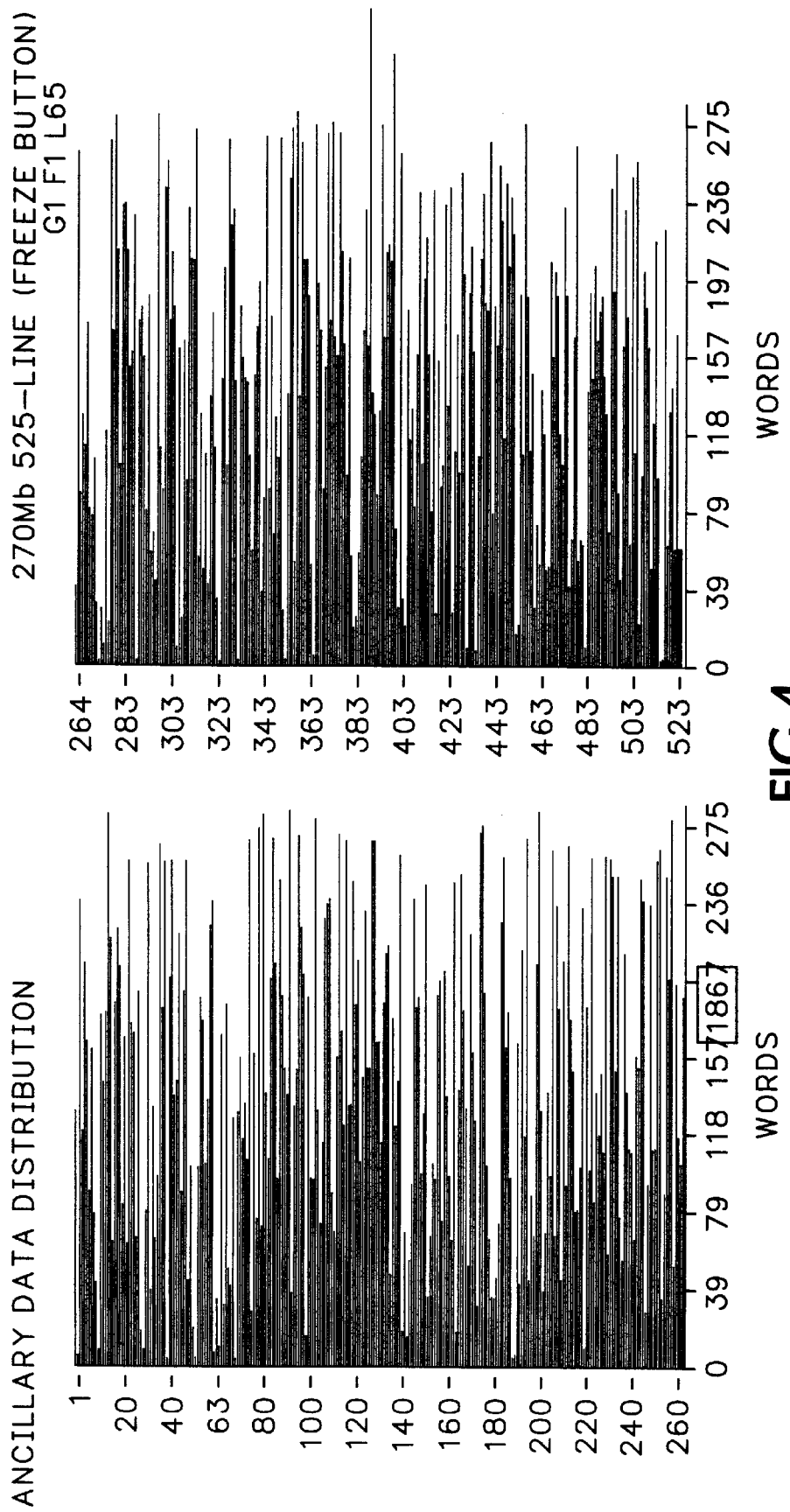
FIG. 4 is a plan view of a screen illustrating a word ancillary data distribution display according to the present invention.
Figure 5:
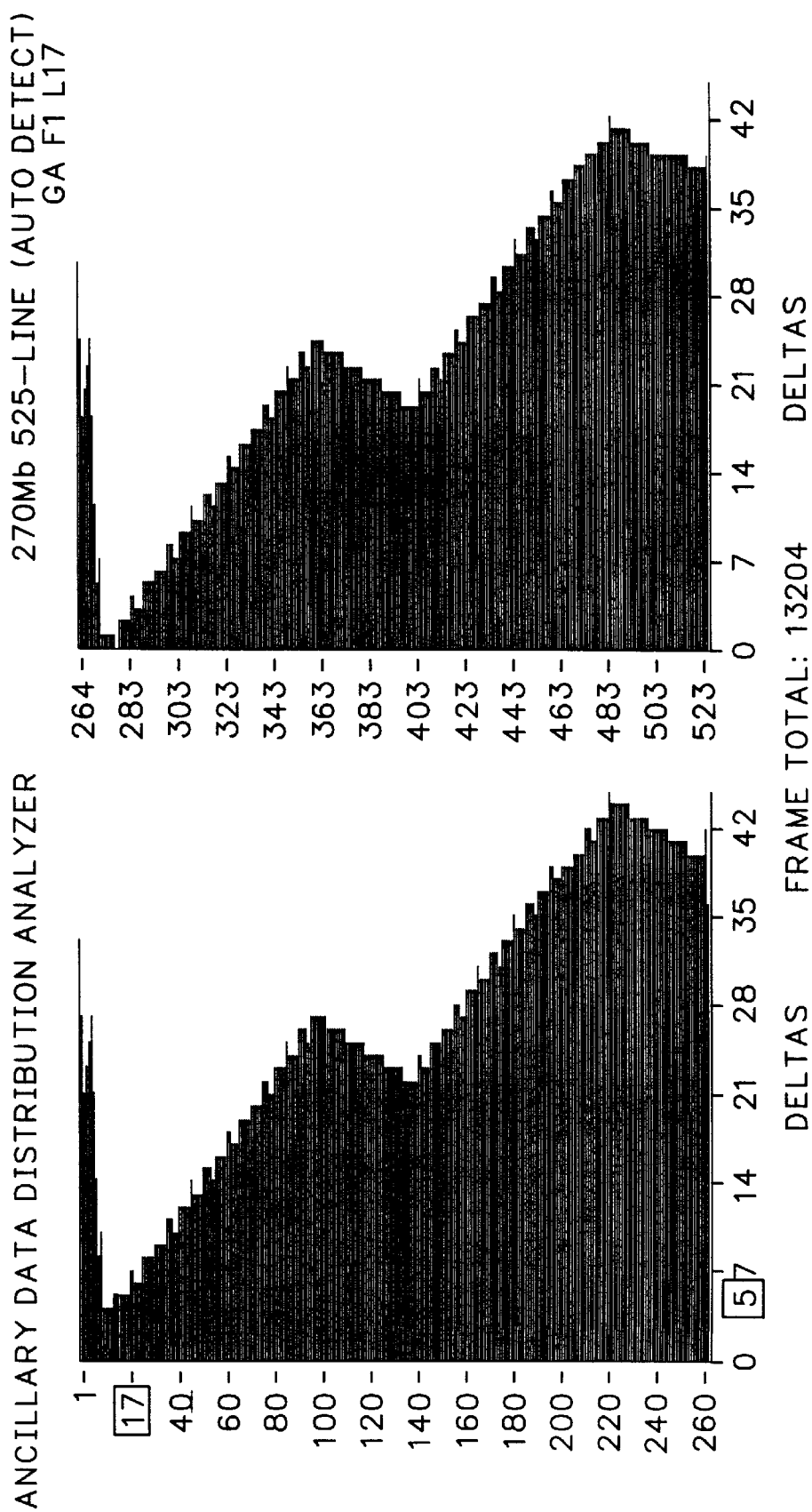
FIG. 5 is a plan view of a screen illustrating a delta ancillary data distribution display according to the present invention.

A line graph is then generated based upon the selected format—packet, word or delta. One axis, as shown in FIGS. 3–5, represents the line numbers where each pixel in the vertical direction corresponds to a different line number. Tic marks are provided periodically, such as every 20 lines, and labeled with a line number. The frame is broken up into two fields (not corresponding to the interlaced fields) for convenience. For the data value axis, based upon the largest data value to be displayed for the frame and the minimum number of pixels specified between tic marks, the tic marks are spaced and an associated data value is computed. For example if there are 200 pixels along the data value axis, the largest data value is 10, and the minimum distance between tic marks is 20 pixels, then tic marks may be spaced twenty pixels apart and each tic mark labeled sequentially. However if the largest data value is 64, then there are 200/64 pixels per unit. At 20 pixels the data value is 6.4 while at 22 pixels the data value is 7.04 so the tic mark is placed at 22 pixels and labeled as data value 7. In like manner the rest of the tic marks are placed on the scale and labeled.

The ancillary data is in the form of packets of words. The ancillary packets are presented per line of a digital frame in a Cartesian format, for example, with line numbers along the y-axis and number of packets along the x-axis. A bar-type display may be used to represent the number of packets for each line. The frame may be divided into two fields, with each field taking up one-half of the display screen 28, as shown in FIG. 3. The packet count along the x-axis may be dynamically scaled, depending upon the maximum packet count for the frame. Any particular line may be selected via a control knob on the instrument panel 28, with the selected line number being highlighted in some manner along the y-axis and the packet count for that line being also highlighted along the x-axis. The bar, or horizontal line, representing the packet count also may be intensified as the line cursor to stand out from the other bars for the other lines. In the screen view of FIG. 3 video line number 212 has been selected and the packet count is 9. For audio data as the ancillary data this is representative. However as shown in FIG. 4 for other data types the number of words per line may vary considerably. In this case line 63 has a word count of 186 with a maximum word count of approximately 275, and the x-axis display has been scaled accordingly. In FIG. 5 the normalized delta values are shown, again with the x-axis being scaled based upon a maximum value of approximately 45.

Thus the present invention provides an ancillary data distribution display by extracting and counting the ancillary data packets for each line of a video frame of a serial digital video data stream, and presents the results, either as packets, words or deltas, in the form of a Cartesian bar graph with a cursor indicating the selected line, the selected line number and the packet/word/delta count being highlighted, the scale for the data value axis being variable depending upon the maximum data count for a line encountered within the video frame.

What is claimed is:

1. A method of displaying ancillary data distribution from a serial digital video data stream comprising the steps of:

extracting the ancillary data from the serial digital video data stream for a video frame;

for each line of the video frame obtaining a data count for the extracted ancillary data; and displaying the data count for each line of the video frame graphically in Cartesian coordinates with line numbers along one axis and data count along the other axis.

2. The method as recited in claim 1 further comprising the steps of:

selecting a specific line from the video frame using a cursor; and highlighting the cursor and alpha-numeric values representing the specific line and corresponding data count.

3. The method as recited in claim 1 further comprising the steps of:

generating from the extracted ancillary data a distribution matrix having three data types for each line of the video frame, the data types being a packet count, a data word count and a normalized delta value; and selecting from the distribution matrix one of the data types for display as the data count.

4. The method as recited in claim 3 wherein generating step comprises the steps of:

obtaining an average number of data words per line for the video frame;

subtracting the average number of data words per line from the actual number of data words per line to produce a raw delta value for each line; and normalizing the raw delta values to produce the normalized data values.

5. An apparatus for displaying ancillary data distribution from a serial digital video data stream comprising:

means for extracting the ancillary data from the serial digital video data stream for a video frame;

for each line of the video frame means for obtaining a data count for the extracted ancillary data; and means for displaying the data count for each line of the video frame graphically in Cartesian coordinates with line numbers along one axis and data count along the other axis.

6. The apparatus as recited in claim 5 further comprising:

means for selecting a specific line from the video frame using a cursor; and means for highlighting the cursor and providing alpha-numeric values representing the specific line and corresponding data count for the displaying means.

7. The apparatus as recited in claim 5 further comprising:

means for generating from the extracted ancillary data a distribution matrix having three data types for each line of the video frame, the data types being a packet count, a data word count and a normalized delta value; and means for selecting from the distribution matrix one of the data types for display as the data count on the displaying means.

8. The apparatus as recited in claim 7 wherein generating means comprises:

means for obtaining an average number of data words per line for the video frame;

means for subtracting the average number of data words per line from the actual number of data words per line to produce a raw delta value for each line; and means for normalizing the raw delta values to produce the normalized data values.

9. An apparatus for displaying ancillary data distribution from a serial digital video data stream comprising:

an acquisition circuit for extracting the ancillary data from the serial digital video data stream for a video frame;

a memory for storing for each line of the video frame a data count for the extracted ancillary data; and a display system for displaying the data count for each line of the video frame graphically in Cartesian coordinates with line numbers along one axis and data count along the other axis.

10. The apparatus as recited in claim 9 further comprising:

a selector for selecting a specific line from the video frame using a cursor; and a generator for highlighting the cursor and providing alpha-numeric values representing the specific line and corresponding data count for the display system.

11. The apparatus as recited in claim 9 further comprising:

a generator for generating from the extracted ancillary data a distribution matrix for storage in the memory, the distribution matrix having three data types for each line of the video frame with the data types being a packet count, a data word count and a normalized delta value; and a selector for selecting from the distribution matrix one of the data types for display as the data count by the display system.

12. The apparatus as recited in claim 11 wherein generator comprises:

an averager for obtaining an average number of data words per line for the video frame;

a subtractor for subtracting the average number of data words per line from the actual number of data words per line to produce a raw delta value for each line; and a normalizer for normalizing the raw delta values to produce the normalized data values.

* * * * *

UNITED STATES PATENT AND TRADEMARK OFFICE
CERTIFICATE OF CORRECTION

PATENT NO : 6,025,848
DATED : February 15, 2000
INVENTOR(S) : Mark Hanley and Randall B. Smith It is certified that error appears in the above-identified patent and that said Letters Patent are hereby corrected as shown below:

Title page, item [75],
Inventor(s): Mark Hanley and Randall B. Smith

Signed and Sealed this

Tenth Day of April, 2001

Attest:

NICHOLAS P. GODICI

Attesting Officer *Acting Director of the United States Patent and Trademark Office*